(12) United States Patent
You

(10) Patent No.: US 11,049,575 B2
(45) Date of Patent: Jun. 29, 2021

(54) MEMORY SYSTEM AND METHOD OF OPERATING THE SAME

(71) Applicant: SK hynix Inc., Gyeonggi-do (KR)

(72) Inventor: Byoung Sung You, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/064,659

(22) Filed: Oct. 7, 2020

(65) Prior Publication Data

US 2021/0020252 A1 Jan. 21, 2021

Related U.S. Application Data

(62) Division of application No. 16/529,239, filed on Aug. 1, 2019, now Pat. No. 10,839,919.

(30) Foreign Application Priority Data

Nov. 26, 2018 (KR) .......................... 10-2018-0147849

(51) Int. Cl.
*G11C 16/30* (2006.01)
*G11C 16/26* (2006.01)
*G06F 11/07* (2006.01)
*G11C 16/34* (2006.01)

(52) U.S. Cl.
CPC .......... *G11C 16/30* (2013.01); *G06F 11/0793* (2013.01); *G11C 16/26* (2013.01); *G11C 16/349* (2013.01); *G11C 16/3418* (2013.01); *G11C 16/3436* (2013.01)

(58) Field of Classification Search
CPC ..... G11C 16/30; G11C 16/26; G11C 16/3418; G11C 16/3436; G11C 16/349; G06F 11/0793
USPC .................................... 365/189.011
See application file for complete search history.

(56) References Cited

U.S. PATENT DOCUMENTS

| 2013/0279249 A1* | 10/2013 | Yun | G11C 16/10 365/185.03 |
| 2016/0004469 A1* | 1/2016 | Yun | G11C 11/005 711/103 |
| 2016/0196181 A1* | 7/2016 | Troia | G06F 11/1048 714/766 |
| 2017/0228284 A1* | 8/2017 | Troia | G11C 16/26 |

* cited by examiner

*Primary Examiner* — Harry W Byrne
(74) *Attorney, Agent, or Firm* — IP & T Group LLP

(57) ABSTRACT

A memory system includes a semiconductor memory device including a memory block; and a scrambler and ECC block configured to generate program data using data received from a host, generate one or more data sets using the program data and page information data, and output the one or more data sets, during a write operation; and a memory controller configured to output the one or more data sets to the semiconductor memory device and to control the semiconductor memory device, wherein the semiconductor memory device is configured to read the page information data stored in each of the plurality of pages and detect, from among the plurality of pages, an erased page or a program-interrupted page in which a sudden power-off (SPO) has occurred during a boot operation.

8 Claims, 10 Drawing Sheets

FIG. 10

| PV7 | PV6 | PV5 | PV4 | PV3 | PV2 | PV1 |
|-----|-----|-----|-----|-----|-----|-----|
| 0/1 | 0/1 | 0/1 | 0/1 | 0/1 | 0/1 | 0/1 |

FIG. 11

| Page State | Value (PV7 ~ PV1) |
|---|---|
| PROGRAM COMPLETION | All "0" |
| SPO OCCURRENCE | "0" AND "1" COEXIST |
| ERASED STATE | All "1" |

MEMORY SYSTEM AND METHOD OF OPERATING THE SAME

CROSS-REFERENCE TO RELATED APPLICATION

This application is a division of U.S. patent application Ser. No. 16/529,239 filed on Aug. 1, 2019, which claims benefits of priority of Korean Patent Application No. 10-2018-0147849 filed on Nov. 26, 2018. The disclosure of each of the foregoing application is incorporated herein by reference in its entirety.

BACKGROUND

Field of Invention

Various embodiments of the present disclosure generally relate to a memory system and a method of operating the memory system, and more particularly, to a memory system configured to search for and identify an erased page or a page in which a sudden power-off (SPO) has occurred when the memory system performs a boot operation, and to a method of operating the memory system.

Description of Related Art

Recently, the paradigm for a computer environment has transitioned to ubiquitous computing so that computer systems can be used anytime and anywhere. Due to this, the use of portable electronic devices such as mobile phones, digital cameras, and notebook computers has rapidly increased. In general, such portable electronic devices use a memory system which employs a memory device, i.e., a data storage device. The data storage device is used as a main memory device or an auxiliary memory device for portable electronic devices.

A data storage device used as a memory device provides advantages in that, since there is no mechanical driving part, stability and durability are excellent, information access speed is very high, and power consumption is low. Data storage devices employed in a memory system having such advantages include a universal serial bus (USB) memory device, memory cards having various interfaces, and a solid state drive (SSD).

SUMMARY

Various embodiments are directed to a memory system, which can rapidly search for an erased page or a page in which a sudden power-off (SPO) has occurred when the memory system performs a boot operation, and to a method of operating the memory system.

An embodiment of the present disclosure may provide for a memory system. The memory system may include a semiconductor memory device including a memory block; and a scrambler and ECC block configured to generate program data using data received from a host, generate one or more data sets using the program data and page information data, and output the one or more data sets, during a write operation; and a memory controller configured to output the one or more data sets to the semiconductor memory device and to control the semiconductor memory device so that the semiconductor memory device performs the write operation, wherein the semiconductor memory device is configured to program the one or more data sets received from the memory controller to a plurality of pages in the memory block during the write operation, and is configured to read the page information data stored in each of the plurality of pages and detect, from among the plurality of pages, an erased page or a program-interrupted page in which a sudden power-off (SPO) has occurred during a boot operation.

An embodiment of the present disclosure may provide for a method of operating a memory system. The method may include queuing a command for controlling an erased page search operation during a boot operation, and performing the erased page search operation on a plurality of pages in response to the command. The erased page search operation may include reading pieces of status check data stored in a page selected from among the plurality of pages, and determining status information of the selected page based on the status check data, and then determining whether the selected page is a program-completed page, an erased page or a program-interrupted page in which a sudden power-off (SPO) has occurred.

An embodiment of the present disclosure may provide for a memory system. The memory system may include a host configured to output a write request and data to be programmed; a memory controller configured to generate program data using the data received from the host in response to the write request, generate one or more data sets using the program data and page information data, and output the one or more data sets; and a semiconductor memory device including a memory block and configured to receive the one or more data sets and store the one or more data sets in the memory block, wherein the semiconductor memory device is configured to program the one or more data sets received from the memory controller to a plurality of pages in the memory block during the write operation, and is configured to read the page information data stored in each of the plurality of pages and detect, from among the plurality of pages, an erased page or a program-interrupted page in which a sudden power-off (SPO) has occurred during a boot operation.

BRIEF DESCRIPTION OF THE DRAWINGS

FIG. 10 is a diagram showing data values corresponding respective programmed states.

FIG. 11 is a diagram showing page information values for different page states.

DETAILED DESCRIPTION

Figure 1:
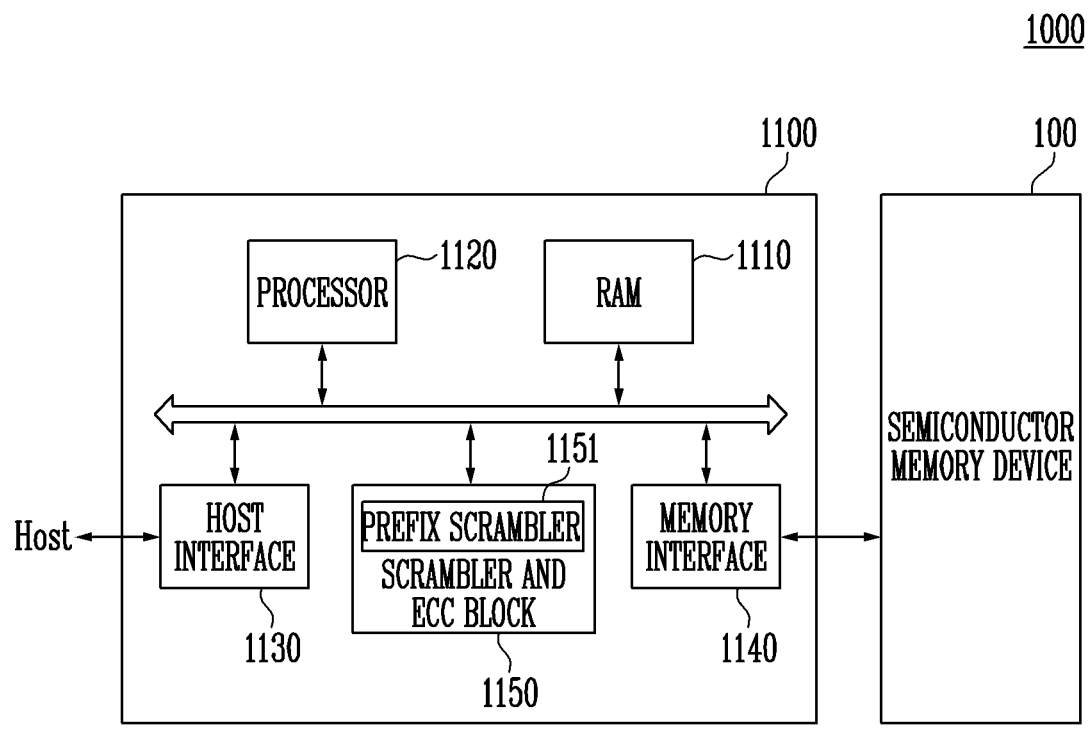
FIG. 1 is a block diagram illustrating a memory system in accordance with an embodiment of the present disclosure.

Specific structural and functional description presented herein is directed to embodiments of the present disclosure. The present invention, however, is not limited to either the specific description provided or any of the embodiments described herein.

While various embodiments are described in detail, the present invention is not limited to any of these embodiments. Rather, the present invention covers all changes, equivalents, substitutes and other embodiments that do not depart from the spirit and technical scope of the present disclosure.

It will be understood that, although the terms "first" and/or "second" may be used herein to identify various elements, these elements should not be limited by these terms. These terms are only used to distinguish one element from another element that otherwise have the same or similar names. For example, a first element in one instance could be termed a second element in another instance without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms and vice versa, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art is omitted to avoid obscuring the subject matter of the present disclosure. This aims to make the subject matter of the present disclosure clear.

Various embodiments of the present disclosure are described more fully below with reference to the accompanying drawings, in which preferred embodiments of the present disclosure are illustrated, so that those skilled in the art are able to practice the present invention. Throughout the specification, reference to "an embodiment," "another embodiment" or the like is not necessarily to only one embodiment, and different references to any such phrase are not necessarily to the same embodiment(s).

FIG. 1 is a block diagram illustrating a memory system in accordance with an embodiment of the present disclosure.

Referring to FIG. 1, a memory system 1000 includes a semiconductor memory device 100 and a memory controller 1100.

The semiconductor memory device 100 may perform read, write, erase and background operations under the control of the memory controller 1100. The semiconductor memory device 100 may include a plurality of memory blocks, each including a status cell area. During a boot operation of the memory system 1000, the semiconductor memory device 100 may search for a page for which a program operation has been completed last before the boot operation is performed, i.e., last-completed program operation, and may search for a next erased page to be subsequently programmed and output the found erased page to the memory controller 1100. Also, when the memory system 1000 is shut down due to abnormal power loss, the semiconductor memory device 100 may search for a page on which a program operation was being performed last when a sudden power-off (SPO) occurred during a boot operation, i.e., last in-progress program operation, and may output the found page to the memory controller 1100.

The memory controller 1100 is coupled to a host and the semiconductor memory device 100. The memory controller 1100 may access the semiconductor memory device 100 in response to a request from the host. For example, the memory controller 1100 may control read, write, erase, and background operations of the semiconductor memory device 100. The memory controller 1100 may provide an interface between the semiconductor memory device 100 and the host. The memory controller 1100 may run firmware for controlling the semiconductor memory device 100.

In accordance with an embodiment of the present disclosure, the memory controller 1100 may output a command for performing control to search the semiconductor memory device 100 for an erased page or a page in which a SPO has occurred to the semiconductor memory device 100 when the memory system 1000 performs a boot operation. The semiconductor memory device 100 performs an operation of searching for an erased page and a page in which a SPO has occurred in response to the command received from the memory controller 1100.

Also, in a boot procedure after abnormal power loss has occurred and then power has been supplied again, the memory controller 1100 may perform a recovery operation attributable to power loss, that is, a power loss recovery operation. For example, the memory controller 1100 may receive information about the page in which the SPO has occurred from the semiconductor memory device 100, and may again perform a program operation on the page in which the SPO has occurred.

The memory controller 1100 may include a random access memory (RAM) 1110, a processor 1120, a host interface 1130, a memory interface 1140, and a scrambler and error correction code (ECC) block 1150.

The RAM 1110 may store firmware, and may be used as a working memory for the processor 1120, a cache memory between the semiconductor memory device 100 and the host, or a buffer memory between the semiconductor memory device 100 and the host. The firmware may include an algorithm for performing an overall operation. The RAM 1110 may store data processed by the memory controller 1100. The RAM 1110 may store pieces of valid data required in order for the memory controller 1100 to control the overall operation of the semiconductor memory device 100.

The processor 1120 may control the overall operation of the memory controller 1100, and may control a program operation, a read operation or an erase operation of the semiconductor memory device 100. Also, the processor 1120 may control the semiconductor memory device 100 so that the semiconductor memory device 100 performs during a boot operation an erased page search operation of searching for an erased page or a page in which a SPO occurred right before the boot operation. Further, the processor 1120 may control the semiconductor memory device 100 so that the semiconductor memory device 100 performs a recovery operation on the page in which the SPO occurred right before the boot procedure after power is restored following the SPO, i.e., an abnormal power loss.

The host interface 1130 includes a protocol for performing data exchange between the host and the memory controller 1100. In an embodiment, the memory controller 1100 may communicate with the host through at least one of various interface protocols, such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial-ATA (SATA) protocol, a parallel-ATA (PATA) protocol, a small computer small interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

During a write operation, the scrambler and ECC block 1150 may generate program data by scrambling and ECC-encoding data received from the host. Also, during a read operation, the scrambler and ECC block 1150 may generate read data by ECC-decoding data received from the semiconductor memory device 100 using an error correction code (ECC) and by descrambling error-corrected data.

Further, the scrambler and ECC block 1150 may include a prefix scrambler 1151. The prefix scrambler 1151 may generate status check data fixed at specific data values during a write operation. A detailed operation of the prefix scrambler 1151 will be described later with reference to FIG. 6.

Although the scrambler and ECC block 1150 is illustrated and described as being included in the memory controller 1100 in accordance with an embodiment of the present disclosure, in another embodiment, the scrambler and ECC block 1150 may be configured as a separate component disposed externally to the memory controller 1100.

In an embodiment of the present disclosure, the processor 1120 may generate data sets by adding page information data to the program data generated by the scrambler and ECC block 1150 during a write operation. Here, the page information data may include basic information about a page in which the corresponding data set is to be stored (e.g., a program scheme such as SLC, MLC, or TLC), the number of erase/program cycles, and status check data for determining the program status of the corresponding page.

The semiconductor memory device 100 may read the page information data from the corresponding data set during a read operation, and may check, using the status check data of the read page information data, whether the selected page is in a program-completed state, in an erased state or in a state in which a SPO has occurred while a program operation is being performed. This operation will be described in detail later.

The memory controller 1100 and the semiconductor memory device 100 may be integrated into a single semiconductor device. In an embodiment, the memory controller 1100 and the semiconductor memory device 100 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

In another embodiment, the memory controller 1100 and the semiconductor memory device 100 may be integrated into a single semiconductor device to form a solid state drive (SSD). The SSD includes a storage device configured to store data in a semiconductor memory. When the memory system 1000 is used as an SSD, the operating speed of the host coupled to the memory system 1000 may be improved.

In an embodiment, the memory system 1000 may be provided as one of various elements of an electronic device, such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or one of various elements for forming a computing system.

In an embodiment, the semiconductor memory device 100 or the memory system 1000 may be mounted in various types of packages. For example, the semiconductor memory device 100 or the memory system 1000 may be packaged and mounted by a method, such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 2:
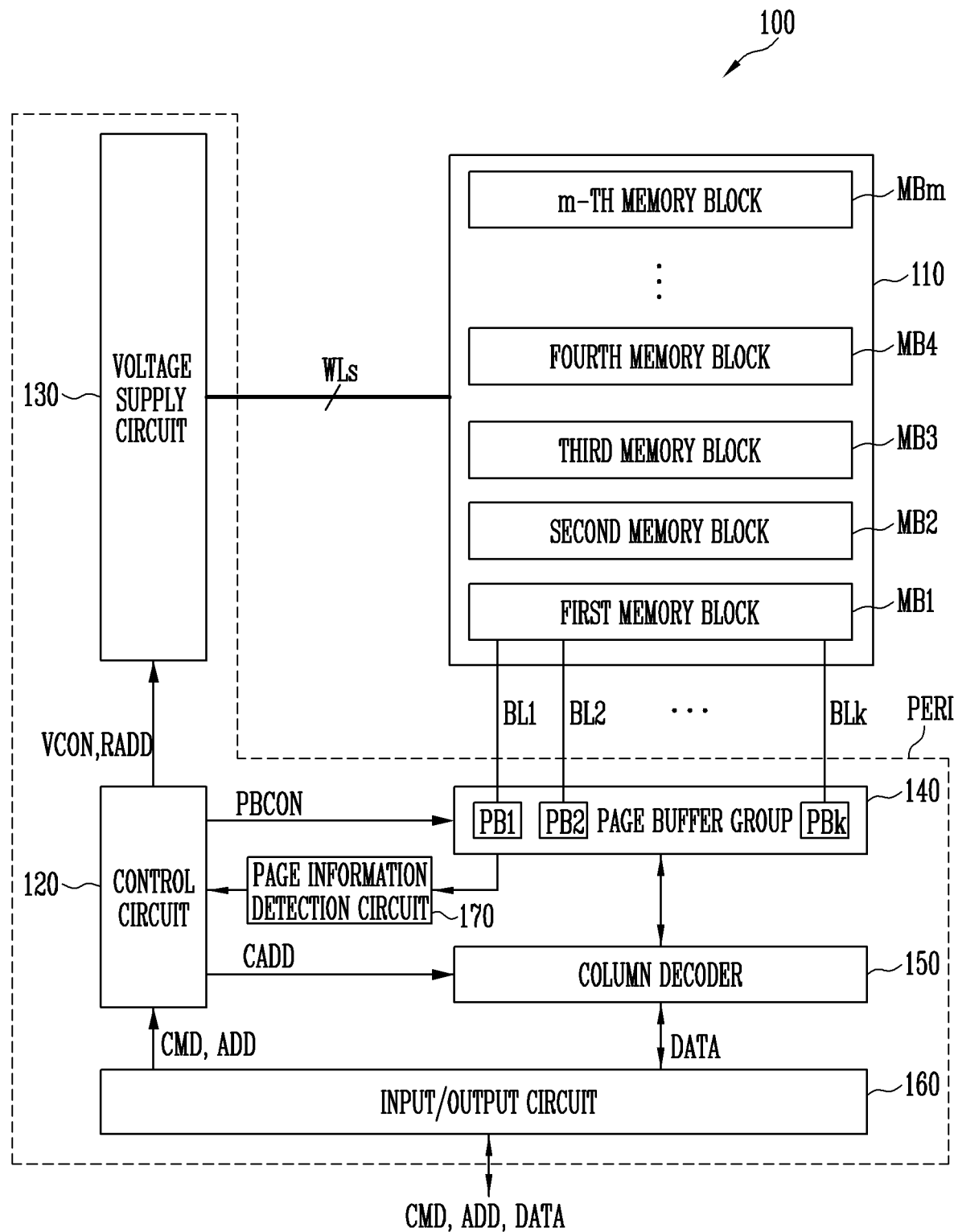
FIG. 2 is a block diagram illustrating a semiconductor memory device, such as that of FIG. 1.

FIG. 2 is a block diagram illustrating a semiconductor memory device, such as that of FIG. 1.

Referring to FIG. 2, the semiconductor memory device 100 in accordance with an embodiment of the present disclosure may include a memory cell array 110 configured to include first to m-th memory blocks MB1 to MBm and a peripheral circuit PERI configured to perform a program operation and a read operation on memory cells included in a selected page of the memory blocks MB1 to MBm. The peripheral circuit PERI may include a control circuit 120, a voltage supply circuit 130, a page buffer group 140, a column decoder 150, an input/output circuit 160, and a page information detection circuit 170.

The memory cell array 110 may include the plurality of memory blocks MB1 to MBm. Each of the memory blocks MB1 to MBm may include a plurality of pages. Each of the plurality of pages may include a plurality of memory cells. In an embodiment, the plurality of memory cells may be nonvolatile memory cells. This will be described in detail later with reference to FIGS. 3 and 4.

The control circuit 120 may output a voltage control signal VCON for generating voltages required in order to perform a program operation or a read operation in response to a command CMD that is externally input through the input/output circuit 160, and may output a page buffer (PB) control signal PBCON for controlling page buffers PB1 to PBk included in the page buffer group 140 depending on the type of operation. Also, the control circuit 120 may output row address signals RADD and column address signals CADD in response to an address signal ADD that is externally input through the input/output circuit 160.

The voltage supply circuit 130 may supply operating voltages required for a program operation, a read operation or an erase operation on memory cells to local lines including a drain select line, word lines WLs, and a source select line of a selected memory block in response to the voltage control signal VCON from the control circuit 120. Such a voltage supply circuit 130 may include a voltage generation circuit and a row decoder.

The voltage generation circuit may output the operating voltages required for the program operation, the read operation or the erase operation on the memory cells to global lines in response to the voltage control signal VCON from the control circuit 120.

The row decoder may couple the global lines to the local lines so that the operating voltages, which are output from the voltage generation circuit to the global lines, are transferred to the local lines of the memory block selected from the memory cell array 110 in response to the row address signals RADD from the control circuit 120.

The page buffer group 140 may include the plurality of page buffers PB1 to PBk coupled to the memory cell array 110 through bit lines BL1 to BLk, respectively. The page buffers PB1 to PBk of the page buffer group 140 selectively precharge the bit lines BL1 to BLk depending on input data so as to store data in memory cells or senses the voltages of the bit lines BL1 to BLk so as to read data from the memory cells, in response to the PB control signal PBCON from the control circuit 120.

The page buffer group 140 may perform a page information read operation for searching the selected memory block for an erased page and a page, in which a sudden power-off (SPO) has occurred, under the control of the control circuit 120 during a boot operation. The page buffer group 140 may read memory cells, in which page information data is stored, from the selected page of the selected memory block. The page may be selected through a binary search algorithm. Further, the page buffer group 140 may be performed using half-page sensing for reading a half area of a page including memory cells in which page information data is stored, among individual pages of the selected memory block, during the page information read operation.

The column decoder 150 may select the page buffers PB1 to PBk included in the page buffer group 140 in response to the column address signals CADD output from the control circuit 120. That is, the column decoder 150 sequentially transfers data to be stored in the memory cells to the page buffers PB1 to PBk in response to the column address signals CADD. Further, the column decoder 150 sequentially selects the page buffers PB1 to PBk in response to the column address signals CADD so that the data of the memory cells, latched in the page buffers PB1 to PBk, is output to an external device through a read operation.

The input/output circuit 160 may transfer externally input data to the column decoder 150 under the control of the control circuit 120 so that such data is input to the page buffer group 140 in order to store the data in memory cells during a program operation. When the column decoder 150 transfers the data received from the input/output circuit 160 to the page buffers PB1 to PBk of the page buffer group 140, the page buffers PB1 to PBk may store the received data in internal latch circuits thereof. Furthermore, during a read operation, the input/output circuit 160 outputs the data, transferred from the page buffers PB1 to PBk of the page buffer group 140 through the column decoder 150, to an external device.

During a boot operation, the page information detection circuit 170 may receive status check data of the page information data read by the page buffer group 140, determine whether the selected page is a program-completed page, an erased page or a page in which a SPO has occurred, depending on the data value of the received status check data, and output the result of the determination to the control circuit 120.

The control circuit 120 may update and store status information for the selected page based on the result of the determination received from the page information detection circuit 170, and may output information about a page in which a SPO has occurred to the memory controller 1100 of FIG. 1.

Figure 3:
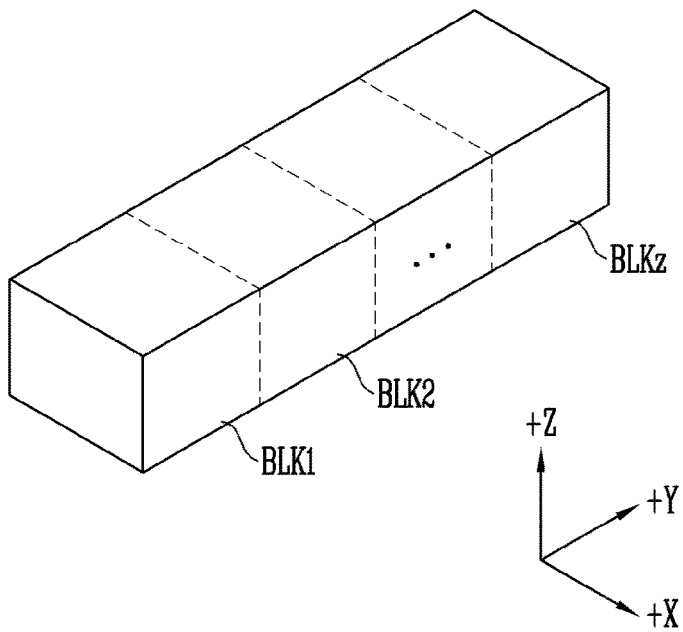
FIG. 3 is a block diagram illustrating an embodiment of a memory cell array of FIG. 2.

FIG. 3 is a block diagram illustrating an embodiment of the memory cell array 110 of FIG. 2.

Referring to FIG. 3, the memory cell array 110 may include a plurality of memory blocks BLK1 to BLKz. Each memory block has a three-dimensional (3D) structure. Each of the memory blocks may include a plurality of memory cells stacked on a substrate. The plurality of memory cells are arranged in +X, +Y, and +Z directions. The structure of each memory block will be described in greater detail below with reference to FIG. 4.

Figure 4:
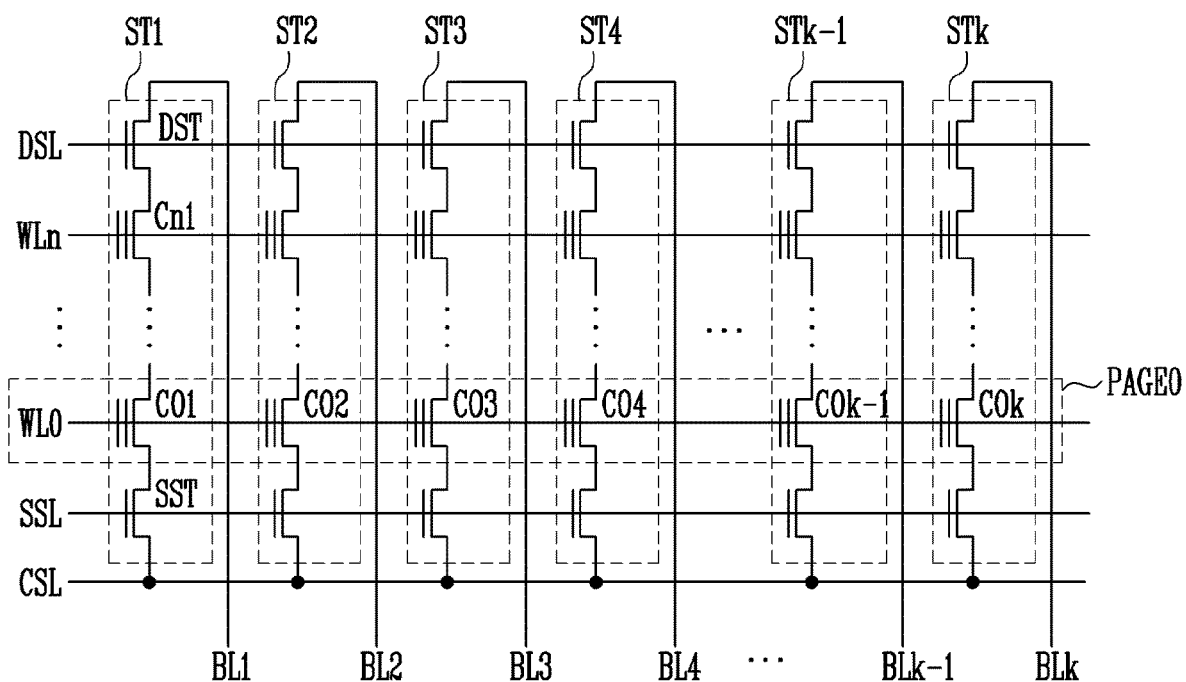
FIG. 4 is a circuit diagram illustrating a memory block, such as that of FIG. 3.

FIG. 4 is a circuit diagram illustrating a memory block, such as that of FIG. 3.

Referring to FIG. 4, each memory block may include a plurality of strings ST1 to STk which are coupled between bit lines BL1 to BLk and a common source line CSL. That is, the strings ST1 to STk may be coupled to the corresponding bit lines BL1 to BLk, respectively, and may be coupled in common to the common source line CSL. Each string (e.g., ST1) may include a source select transistor SST, a source of which is coupled to the common source line CSL, a plurality of memory cells C01 to Cn1, and a drain select transistor DST, a drain of which is coupled to the corresponding bit line BL1. The memory cells C01 to Cn1 may be coupled in series between the select transistors SST and DST. A gate of the source select transistor SST may be coupled to a source select line SSL. Gates of the memory cells C01 to Cn1 may be coupled to word lines WL0 to WLn, respectively. A gate of the drain select transistor DST may be coupled to a drain select line DSL.

The memory cells included in the memory block may be classified by a physical page unit or a logical page unit. For example, memory cells C01 to C0$k$ coupled to a single word line (e.g., WL0) may constitute a single physical page PAGE0. Such a page may be the basic unit of a program operation or a read operation.

Figure 5:
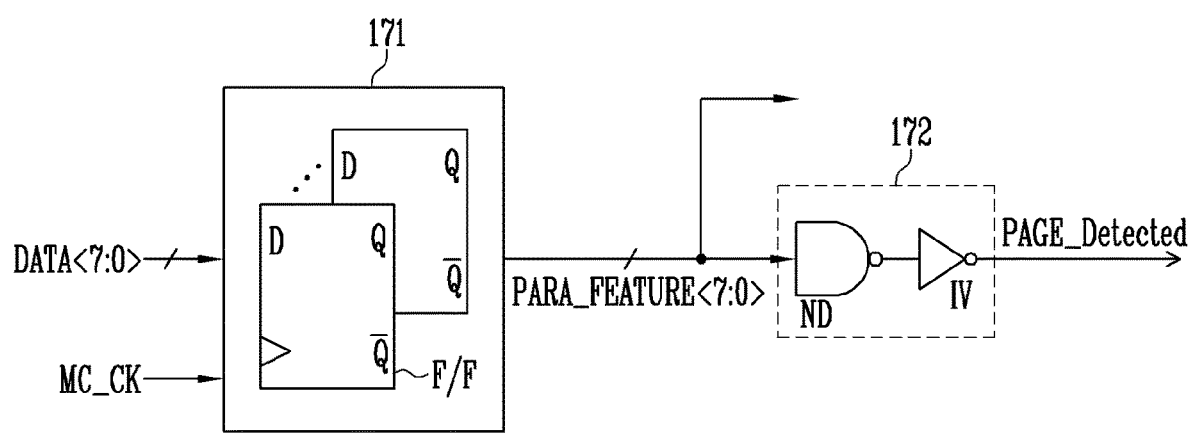
FIG. 5 is a circuit diagram illustrating a page information detection circuit, such as that of FIG. 2.

FIG. 5 is a circuit diagram illustrating a page information detection circuit, such as that of FIG. 2.

Referring to FIG. 5, the page information detection circuit may include a register circuit 171 and a page status signal generation circuit 172.

The register circuit 171 may receive a plurality of pieces of status check data DATA<7:0>, among pieces of page information data read by the page buffer group 140 of FIG. 2, and may latch the received status check data DATA<7:0> in response to a micro-clock MC_CK. The register circuit 171 may include a plurality of flip-flops (F/F), and each of the plurality of flip-flops (F/F) may store a corresponding piece of status check data DATA<7:0>. The register circuit 171 may output the stored status check data DATA <7:0> as output data signals PARA_FEATURE<7:0>. The output data signals PARA_FEATURE<7:0> are output both to the page status signal generation circuit 172 and the control circuit 120 of FIG. 2. The control circuit 120 may determine whether the selected page is a program-completed page or a page in which a SPO has occurred, depending on the output data signals PARA_FEATURE<7:0>.

The page status signal generation circuit 172 may determine whether the selected page is an erased page or a programmed page in response to the output data signals PARA_FEATURE<7:0>, and then generate and output a page detection signal PAGE_Detected.

The page status signal generation circuit 172 may include a NAND gate ND and an inverter IV. The NAND gate ND may receive the plurality of output data signals PARA_FEATURE<7:0>, perform a logical operation on the output data signals, and output the result of the logical operation. The inverter IV may invert the output signal of the NAND gate ND and output the inverted signal as the page detection signal PAGE_Detected. For example, when all of the plurality of output data signals PARA_FEATURE<7:0> have a value of "1", the page status signal generation circuit 172 may output the page detection signal PAGE_Detected having a value of "1" indicating that the selected page is an erased page. In contrast, when all of the plurality of output data signals PARA_FEATURE<7:0> have a value of "0" or when at least one of the output data signals has a value of "0", the page status signal generation circuit 172 may output the page detection signal PAGE_Detected having a value of "0" indicating that the selected page is a program-completed page or a page in which a SPO has occurred.

Figure 6:
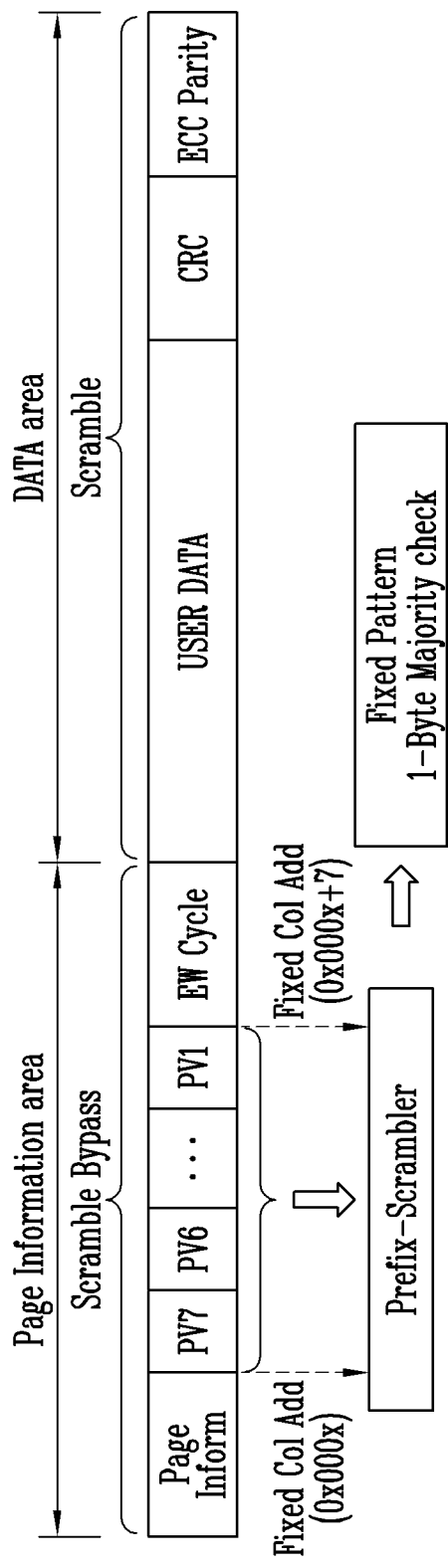
FIG. 6 is a diagram illustrating a configuration of a data set that is transmitted from a memory controller to a semiconductor memory device.

FIG. 6 is a diagram illustrating a configuration of a data set that is transmitted from a memory controller, such as that of FIG. 1, to a semiconductor memory device during a write operation of a memory system.

Referring to FIG. 6, the data set may be configured to include a page information area and a data area.

The page information area may be generated by the processor 1120, and may include page information data. For example, the page information area may include basic information of a page (Page Inform), status check data PV7 to PV1, and data about the number of erase/program cycles of the corresponding page (EW Cycle).

The data area may be generated by the scrambler and ECC block 1150, and may include user data, a Cyclic Redundancy Code (CRC), and ECC parity.

Also, the data area is scrambled by the scrambler and ECC block 1150, whereas the page information area is generated by the processor 1120 and is not scrambled.

Further, the status check data PV7 to PV1 included in the page information area may be generated as fixed values by the prefix scrambler 1151 in the scrambler and ECC block 1150. For example, the status check data PV7 to PV1 to be stored at set column addresses 0x000x to 0x000x+7 are generated as fixed values by the prefix scrambler 1151. Here, the fixed values of the status check data PV7 to PV1 will be described later with reference to FIG. 10.

Figure 7:
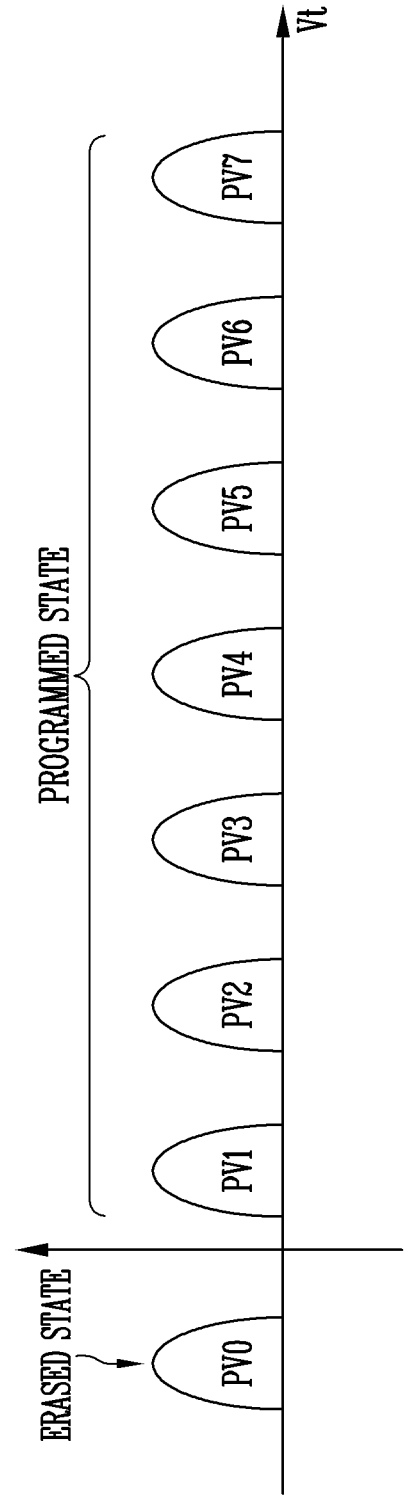
FIG. 7 is a threshold voltage distribution diagram illustrating programmed states of memory cells.

FIG. 7 is a threshold voltage distribution diagram illustrating programmed states of memory cells.

Referring to FIG. 7, triple-level cells (TLC) have a threshold voltage distribution of an erased state PV0 and a plurality of programmed states PV1 to PV7. The plurality of programmed states PV1 to PV7 may indicate states of memory cells of a page on which a program operation is sequentially performed.

Therefore, pieces of status check data PV7 to PV1 of FIG. 6 are data values respectively corresponding to the plurality of programmed states PV7 to PV1 of FIG. 7, and may be set to "0" corresponding to a programmed state during a write operation. The status check data PV7 to PV1 may be programmed together with user data included in the data area when the user data is programmed to a selected page. For example, when data, corresponding to programmed state PV1, in the user data is programmed, the status check data PV1 may be programmed. When data, corresponding to programmed state PV2, in the user data is programmed, the status check data PV2 may be programmed. When data, corresponding to programmed state PV7, in the user data is programmed, the status check data PV7 may be programmed. Therefore, the status check data value of a page may indicate whether or not the page has been completely programmed. The page may not be completely programmed when an SPO occurred while the program operation was being performed, such page being a program-interrupted page. For example, when all of pieces of read status check data have a value of "0" as a result of a read operation on a selected page, it may be determined that the selected page is a program-completed page. In contrast, when all of pieces of read status check data have a value of "1", it may be determined that the selected page is an erased page in which a program operation was not performed. When the pieces of read status check data include at least one value of "0" and at least one value of "1", it may be determined that the selected page is a program-interrupted page in which a SPO occurred while a program operation was being performed. Also, a time at which SPO occurred may be inferred depending on the read status data values.

Figure 8:
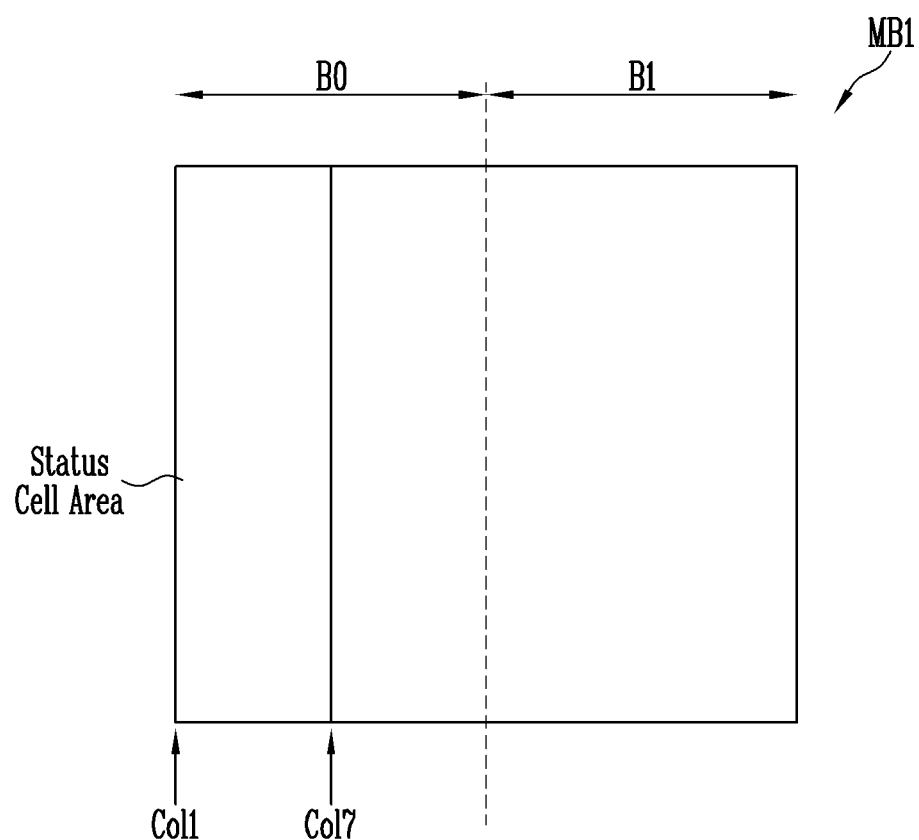
FIG. 8 is a diagram illustrating an area in which page information is stored in a memory block.

FIG. 8 is a diagram illustrating an area in which page information is stored in a memory block, such as that of FIG. 3.

Referring to FIG. 8, a memory block (e.g., MB1) may be divided into a first block area B0 and a second block area B1, which may be respectively formed by bisecting each of a plurality of pages in the corresponding memory block. That is, one portion of each page in the memory block MB1 is part of the first block area B0, and the other portion of that page is part of the second block area B1.

A read operation may be performed on the first block area B0 and the second block area B1 in such a way that, when a read operation is performed using half-page sensing, only a single block area (e.g., B0) is selected and a read operation is performed on the block area B0.

Also, a partial area of the first block area B0, selected when the read operation is performed using half-page sensing, may be defined as a status cell area. Pieces of status check data PV1 to PV7 of FIG. 6, corresponding to each page, may be programmed to the status cell area. Further, column addresses Col 1 to Col 7 may be designated for respective pieces of status check data PV1 to PV7, and then the pieces of status check data PV1 to PV7 may be stored in memory cells of the status cell area matching the corresponding column addresses.

Figure 9:
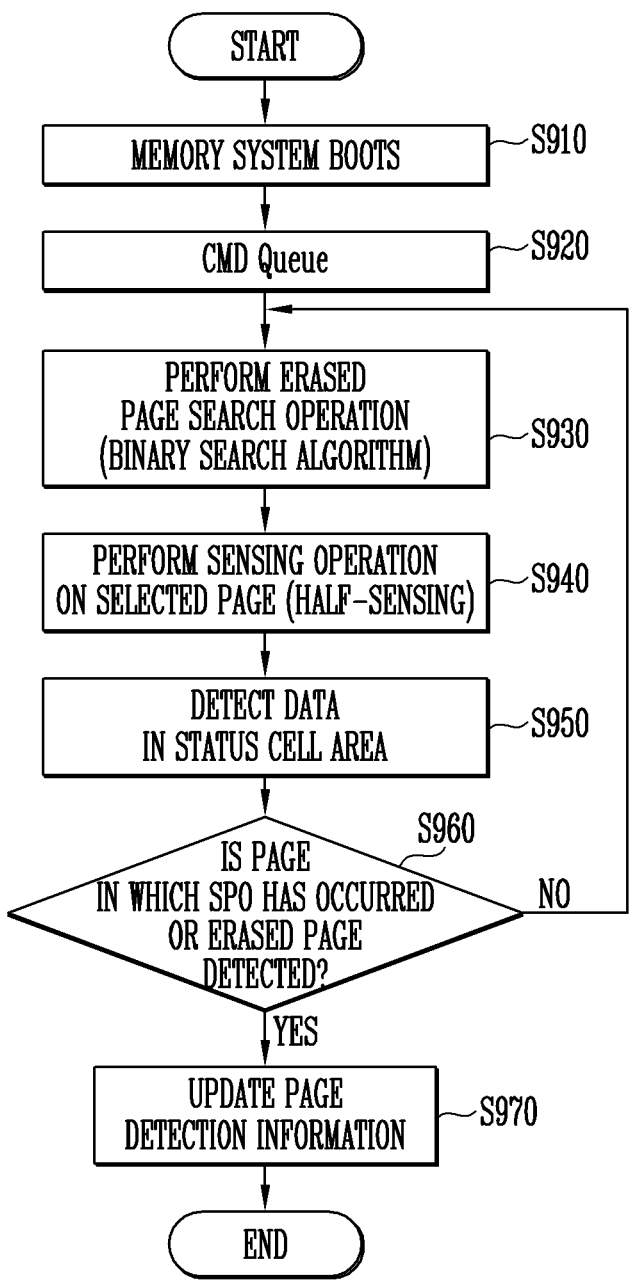
FIG. 9 is a flowchart illustrating the operation of a memory system in accordance with an embodiment of the present disclosure.

FIG. 9 is a flowchart illustrating operation of a memory system in accordance with an embodiment of the present disclosure.

FIG. 10 is a diagram illustrating data values corresponding to respective programmed states, which values are included in page information.

FIG. 11 is a diagram illustrating page information values for different page states.

The operation of the memory system in accordance with the present embodiment is described with reference to FIGS. 1 to 11.

When power is supplied to the memory system 1000, and the memory system 1000 boots at step S910. Then, at step 920, the processor 1120 may generate and queue a command CMD for controlling the semiconductor memory device 100 so that the semiconductor memory device 100 searches for an erased page or a page in which a SPO has occurred.

The semiconductor memory device 100 performs an erased page search operation in response to a command CMD output from the memory controller 1100 at step S930.

The control circuit 120 may control the voltage supply circuit 130 and the page buffer group 140 so that a read operation is performed on a plurality of pages included in a memory block (e.g., MB1), which pages are selected based on a binary search algorithm, when the erased page search operation is performed.

For example, the voltage supply circuit 130 may generate a read voltage and apply the read voltage to a word line coupled to a selected page of the selected memory block, and the page buffer group 140 may sense the voltages of bit lines BL1 to BLk and then perform a sensing operation on the selected page at step S940.

Here, the page buffer group 140 may perform a read operation on the first block area B0, including the status cell area, in the memory block MB1 using half-page sensing. As a result, current consumption in the read operation may be reduced, and the speed of the read operation may be improved, compared to a case where the entire page is read.

Thereafter, the page information detection circuit 170 receives pieces of status check data DATA<7:0> read from the status cell area of the selected page, among pieces of data (i.e., the page information data exemplified in FIG. 6) read from the selected page stored in the page buffer group 140, and then detects the status of the selected page at step S950.

As illustrated in FIGS. 10 and 11, during a write operation of the memory system 1000, pieces of status check data PV7 to PV1 generated by the processor 1120 may be initially set to a value of "0", and then be programmed. Therefore, all pieces of status check data DATA<7:0>, which are read from a page for which the program operation has been normally completed, have a value of "0". In contrast, in the case of a page for which a program operation is not performed, memory cells in the status cell area are in an erased state, and thus values of the read status check data DATA<7:0> may be "1". In contrast, pieces of status check data DATA<7:0> read from a page in which a SPO occurred while the program operation was being performed have values of both "0" and "1". For example, when SPO occurs while a program operation corresponding to the programmed state PV4 is being performed, the values of pieces of status check data corresponding to PV1, PV2, and PV3 may be "0", and the values of pieces of status check data corresponding to PV4, PV5, PV6, and PV7 may be "1".

The page information detection circuit 170 may generate output data signals PARA_FEATURE<7:0> and a page detection signal PAGE_Detected depending on the received status check data DATA<7:0>, and may output the signals PARA_FEATURE<7:0> and PAGE_Detected to the control circuit 120. The control circuit 120 determines at step S960, whether the selected page is a programmed page or an erased page in response to the page detection signal PAGE_Detected, and determines, based on the output data signals PARA_FEATURE<7:0>, whether the selected page is a program-interrupted page in which a SPO has occurred or a program-completed page for which the program operation has been normally completed, when it is determined that the selected page is a programmed page.

As a result of the determination, when it is determined that the selected page is the program-completed page for which the program operation has been normally completed, the process returns to step S930 where a new page is selected based on the binary search algorithm, after which a procedure starting from the erased page search operation is performed again.

When it is determined that the selected page is a program-interrupted page in which a SPO has occurred or an erased page, the control circuit 120 may store detection information about the selected page or may output the page detection information to the memory controller 1100 and then update the page detection information at step S970.

The memory controller 1100 may receive information about the erased page or the program-interrupted page in which the SPO has occurred from the semiconductor memory device 100. The memory controller 1100 may control the semiconductor memory device 100 so that a program operation is performed first on the found erased page using the erased page information during the program operation of the semiconductor memory device 100, and so that a recovery operation is performed on the program-interrupted page in which the SPO has occurred by using SPO occurrence page information.

As described above, embodiments of the present disclosure may additionally configure status check data in a page information area of a data set during a write operation of a semiconductor memory device, and may determine the status of a selected page using only data stored in a status cell area during an erased page detection operation, thus improving the operating speed of the semiconductor memory device.

Figure 12:
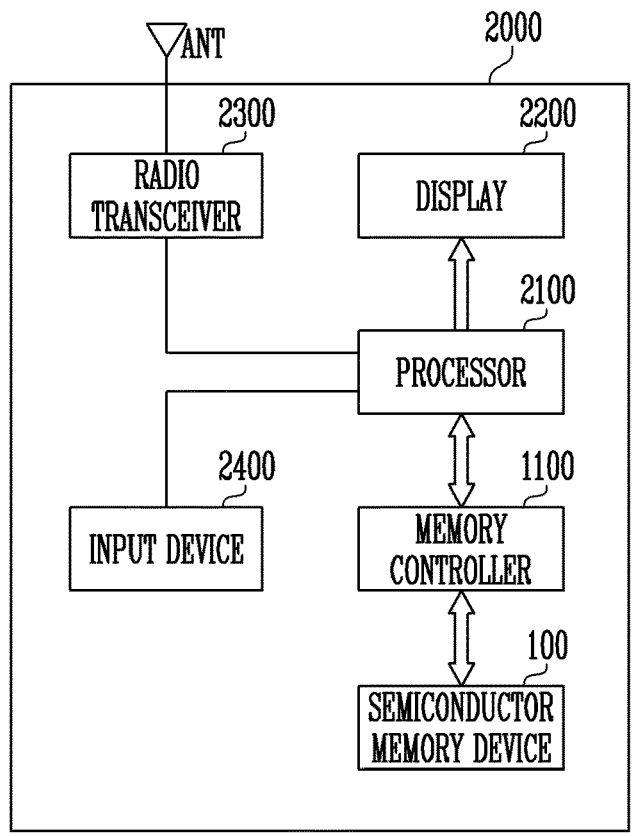
FIG. 12 is a diagram illustrating an embodiment of a memory system.

FIG. 12 is a diagram illustrating an embodiment of a memory system.

Referring to FIG. 12, a memory system 2000 may be implemented as a cellular phone, a smart phone, a tablet PC, a personal digital assistant (PDA) or a wireless communication device. The memory system 2000 may include a semiconductor memory device 100 and a memory controller 1100 that is capable of controlling the operation of the semiconductor memory device 100. The memory controller 1100 may control a data access operation for the semiconductor memory device 100, for example, a program operation, an erase operation or a read operation, under the control of a processor 2100.

Data programmed to the semiconductor storage device 100 may be output via a display 2200 under the control of the memory controller 1100.

A radio transceiver 2300 may exchange radio signals through an antenna ANT. For example, the radio transceiver 2300 may convert radio signals received through the antenna ANT into signals that may be processed by the processor 2100. Therefore, the processor 2100 may process the signals output from the radio transceiver 2300, and may transmit the processed signals to the memory controller 1100 or the display 2200. The memory controller 1100 may program the signals processed by the processor 2100 to the semiconductor memory device 100. Further, the radio transceiver 2300 may convert signals output from the processor 2100 into radio signals and output the radio signals to an external device through the antenna ANT. An input device 2400 may be used to input a control signal for controlling the operation of the processor 2100 or data to be processed by the processor 2100. The input device 2400 may be implemented as a pointing device such as a touch pad or a computer mouse, a keypad or a keyboard. The processor 2100 may control the operation of the display 2200 so that data output from the memory controller 1100, data output from the radio transceiver 2300, or data output from the input device 2400 is output via the display 2200.

In an embodiment, the memory controller 1100 capable of controlling the operation of the semiconductor memory device 100 may be implemented as a part of the processor 2100 or as a chip provided separately from the processor 2100. Further, the memory controller 1100 may be implemented through the example of the memory controller 1100 illustrated in FIG. 1.

Figure 13:
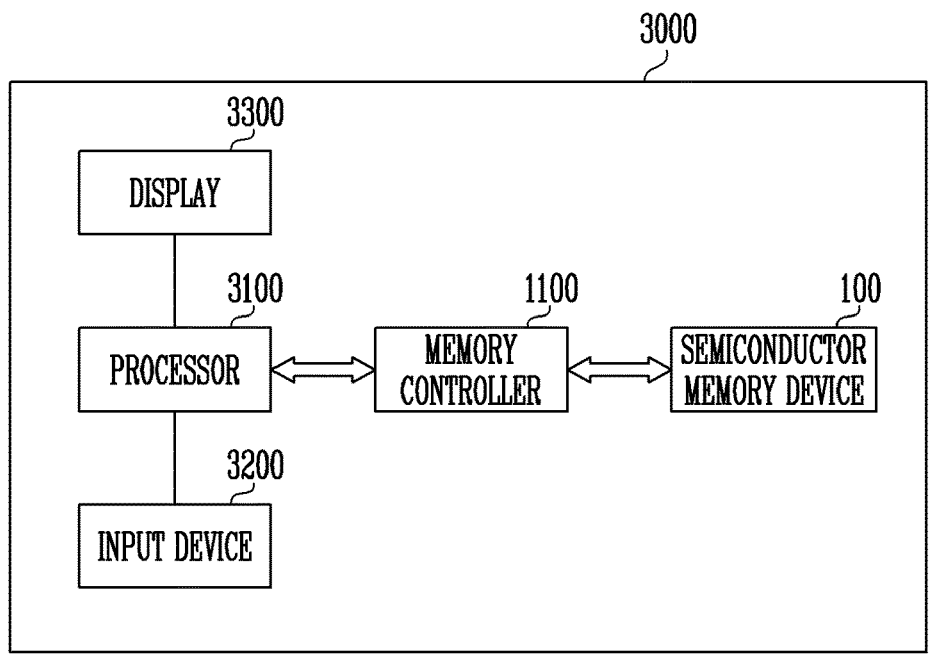
FIG. 13 is a diagram illustrating an embodiment of a memory system.

FIG. 13 is a diagram illustrating an embodiment of a memory system.

Referring to FIG. 13, a memory system 3000 may be implemented in a personal computer, a tablet PC, a net-book, an e-reader, a personal digital assistant (PDA), a portable multimedia player (PMP), an MP3 player, or an MP4 player.

The memory system 3000 may include a semiconductor memory device 100 and a memory controller 1100 that is capable of controlling the operation of the semiconductor memory device 100.

A processor 3100 may output data, stored in the semiconductor memory device 100, via a display 3300 according to data input through an input device 3200. For example, the input device 3200 may be implemented as a pointing device such as a touch pad or a computer mouse, a keypad or a keyboard.

The processor 3100 may control the overall operation of the memory system 3000, and may control the operation of the memory controller 1100. In an embodiment, the memory controller 1100 capable of controlling the operation of the semiconductor memory device 100 may be implemented as a part of the processor 3100 or as a chip provided separately from the processor 3100. Further, the memory controller 1100 may be implemented through the example of the memory controller 1100 illustrated in FIG. 1.

Figure 14:
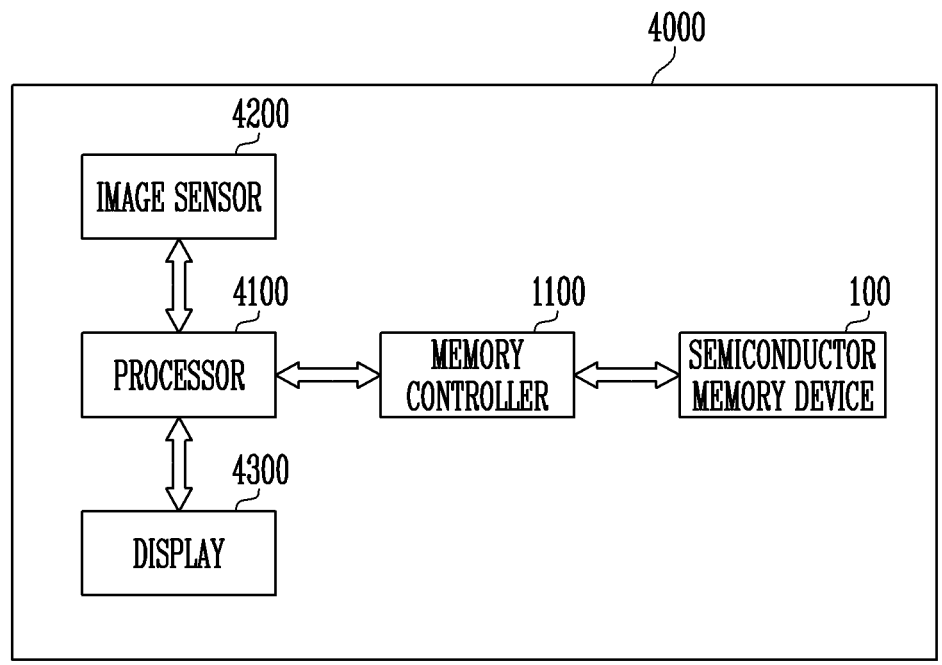
FIG. 14 is a diagram illustrating an embodiment of a memory system.

FIG. 14 is a diagram illustrating an embodiment of a memory system.

Referring to FIG. 14, a memory system 4000 may be implemented in an image processing device, for example, a digital camera, a mobile phone provided with a digital camera, a smartphone provided with a digital camera, or a tablet PC provided with a digital camera.

The memory system 4000 may include a semiconductor memory device 100 and a memory controller 1100 that is capable of controlling a data processing operation for the semiconductor memory device 100, for example, a program operation, an erase operation or a read operation.

An image sensor 4200 of the memory system 4000 may convert an optical image into digital signals, and the converted digital signals may be transmitted to a processor 4100 or the memory controller 1100. Under the control of the processor 4100, the converted digital signals may be output via a display 4300 or stored in the semiconductor memory device 100 through the memory controller 1100. Also, data stored in the semiconductor storage device 100 may be output via the display 4300 under the control of the processor 4100 or the memory controller 1100.

In an embodiment, the memory controller 1100 capable of controlling the operation of the semiconductor memory device 100 may be implemented as a part of the processor 4100 or as a chip provided separately from the processor 4100. Further, the memory controller 1100 may be implemented through the example of the memory controller 1100 illustrated in FIG. 1.

Figure 15:
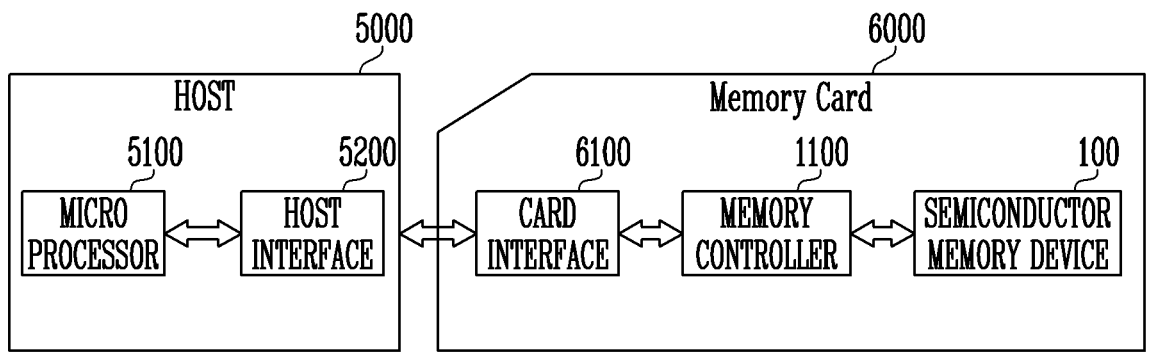
FIG. 15 is a diagram illustrating an embodiment of a memory system.

FIG. 15 is a diagram illustrating an embodiment of a memory system.

Referring to FIG. 15, a memory system 6000 may be implemented as a memory card or a smart card. The memory system 6000 may include a semiconductor memory device 100, a memory controller 1100, and a card interface 6100.

The memory controller 1100 may control data exchange between the semiconductor memory device 100 and the card interface 6100. In an embodiment, the card interface 6100 may be, but is not limited to, a secure digital (SD) card interface or a multi-media card (MMC) interface. Further, the memory controller 1100 may be implemented through the example of the memory controller 1100 illustrated in FIG. 1.

Further, the card interface 6100 may interface data exchange between a host 5000 and the memory controller 1100 according to a protocol of the host 5000. In an embodiment, the card interface 6100 may support a universal serial bus (USB) protocol and an interchip (IC)-USB protocol. Here, the card interface 6100 may refer to hardware capable of supporting a protocol which is used by the host 5000, software installed in the hardware, or a signal transmission method performed by the hardware.

When the memory system 6000 is coupled to a host interface 5200 of the host 5000 such as a PC, a tablet PC, a digital camera, a digital audio player, a mobile phone, console video game hardware or a digital set-top box, the host interface 5200 may perform data communication with the semiconductor memory device 100 through the card interface 6100 and the memory controller 1100 under the control of a microprocessor 5100.

In accordance with embodiments of the present disclosure, during a page information detection operation that is performed when a memory system performs a boot operation, an area in which page information is stored may be read, and thus an erased page or a page in which a SPO has occurred may be rapidly detected.

While various embodiments of the present disclosure have been disclosed, those skilled in the art will appreciate in light of the present disclosure that various modifications, additions and substitutions are possible, without departing from the scope and spirit of the present invention. Therefore, the scope of the present invention is defined by the appended claims and their equivalents rather than by the description preceding them.

In the above-discussed embodiments, in some cases one or more steps may be selectively performed or skipped. In addition, the steps may not always be sequentially performed, and may be randomly performed. Furthermore, the embodiments disclosed in herein aim to help those with ordinary knowledge in this art more clearly understand the present invention rather than aiming to limit the bounds of the present invention. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present invention without limiting the subject matter thereof. It should be understood that many variations and modifications of the basic inventive concept described herein will still fall within the spirit and scope of the present invention as defined in the appended claims and their equivalents.

What is claimed is:

1. A method of operating a memory system, comprising:
   queuing a command for controlling an erased page search operation during a boot operation; and
   performing the erased page search operation on a plurality of pages in response to the command,
   wherein the erased page search operation comprises:
   reading pieces of status check data stored in a page selected from among the plurality of pages; and
   determining status information of the selected page based on the status check data, and then determining whether the selected page is a program-completed page, an erased page or a program-interrupted page in which a sudden power-off (SPO) has occurred.

2. The method according to claim 1, further comprising:
   generating program data by scrambling and ECC-encoding data received from a host during a write operation, and generating one or more data sets using the program data and the pieces of status check data; and
   programming the one or more data sets to the plurality of pages.

3. The method according to claim 2, wherein the pieces of status check data have data values respectively corresponding to a plurality of programmed states in which the program data is to be programmed to memory cells in the plurality of pages, and are set to a first data value corresponding to a programmed cell state of the memory cells.

4. The method according to claim 3, wherein the selected page is determined to be a program-completed page when all of the pieces of status check data correspond to the programmed cell state, the selected page is determined to be the erased page when all of the pieces of status check data correspond to an erased cell state, and the selected page is determined to be the page in which the SPO has occurred when at least one of the pieces of status check data corresponds to the programmed cell state and at least one of the pieces of status check data corresponds to the erased cell state.

5. The method according to claim 1, wherein the pieces of status check data are stored in a status cell area of a memory block including the plurality of pages.

6. The method according to claim 5, wherein reading the pieces of status check data is performed to read the status cell area of the memory block using half-page sensing.

7. The method according to claim 1, wherein the erased page search operation is performed based on a binary search algorithm.

8. The method according to claim 1, wherein the selected page is determined to be a program-completed page when all of the pieces of status check data correspond to a programmed cell, the selected page is determined to be the erased page when all of the pieces of status check data correspond to an erased cell, and the selected page is determined to be the program-interrupted page when at least one of the pieces of status check data correspond to the programmed cell and at least one of the pieces of status check data correspond to the erased cell.

* * * * *